US008850375B2

(12) United States Patent  
Zou et al.

(10) Patent No.: US 8,850,375 B2
(45) Date of Patent: Sep. 30, 2014

(54) INTEGRATED CIRCUIT DESIGN AND SIMULATION

(75) Inventors: Xuan Zou, Beijing (CN); Hai Tao Han, Beijing (CN); Wei Liu, Shanghai (CN); Ze Gui Pang, Shanghai (CN); Wen Yin, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 745 days.

(21) Appl. No.: 13/095,099

(22) Filed: Apr. 27, 2011

(65) Prior Publication Data

US 2011/0270598 A1 Nov. 3, 2011

(30) Foreign Application Priority Data

Apr. 30, 2010 (CN) .......................... 2010 1 0162682

(51) Int. Cl.
*G06F 17/50* (2006.01)
(52) U.S. Cl.
CPC ................................ *G06F 17/5036* (2013.01)
USPC ........... 716/115; 716/110; 716/111; 716/132; 716/136

(58) Field of Classification Search
USPC ........................................................ 716/115
See application file for complete search history.

(56) References Cited

U.S. PATENT DOCUMENTS

| | | | |
|---|---|---|---|
| 6,446,016 B1 | 9/2002 | Zhu | |
| 6,495,454 B2 | 12/2002 | Livengood et al. | |
| 6,532,439 B2 * | 3/2003 | Anderson et al. | ................ 703/14 |
| 7,569,912 B2 | 8/2009 | Sze et al. | |
| 2002/0109205 A1 | 8/2002 | Sawada et al. | |
| 2002/0167057 A1 | 11/2002 | Ahn et al. | |
| 2004/0103381 A1* | 5/2004 | Shinomiya | ......................... 716/5 |
| 2007/0045770 A1 | 3/2007 | Aoki | |
| 2009/0212374 A1 | 8/2009 | Huang et al. | |
| 2009/0213558 A1 | 8/2009 | Osaka et al. | |
| 2009/0267124 A1 | 10/2009 | Bosshard | |

FOREIGN PATENT DOCUMENTS

| | | |
|---|---|---|
| CN | 1589495 A | 3/2005 |
| CN | 1630820 A | 6/2005 |
| CN | 1654967 A | 8/2005 |
| EP | 1143507 A1 | 10/2001 |

OTHER PUBLICATIONS

Information Materials for IDS dated Oct. 11, 2012, Prepared by Zhang Xiao Xiao, SIPO Office Action dated Oct. 8, 2012.
Haihua Sun et al., "An Algorithm for Optimal Decoupling Capacitor Sizing and Placement for Standard Cell Layouts," ISPD '02 Internat'l Symposium on Physical Design, NY, 2002.
Bardia Bozorgzadeh et al., "Novel MOS Decoupling Capacitor Optimization Technique for Nanotechnologies," vlsid, pp. 175-180, 2009 22nd Internet'l Conf. on VLSI Design, Jan. 2009.
Jingjing Fu et al., "A Fast Decoupling Cpaacitor Budgeting Algorithm for Robust On-Chip Power Delivery," ASP-DAC '04 Asia & South Pacific Design Automation Conf., 2004.

* cited by examiner

*Primary Examiner* — Jack Chiang
*Assistant Examiner* — Eric Lee
(74) *Attorney, Agent, or Firm* — Joseph P. Abate (57) ABSTRACT

An integrated circuit design method, system and simulator, wherein the integrated circuit design method includes: determining a region in which power supply noise shall be analyzed; determining current model parameters of the region; determining model parameters of a power supply network model; inputting into a simulator a net list; judging whether or not the region satisfies noise requirements of a chip power supply; and if the region satisfies noise requirements of the chip power supply, determining that the initial area is a minimum area that satisfies the noise requirements of the chip power supply in case the initial number of decoupling capacitors are used in the region.

17 Claims, 9 Drawing Sheets

INTEGRATED CIRCUIT DESIGN AND SIMULATION

CROSS REFERENCE TO RELATED APPLICATION

This application claims priority under 35 U.S.C. §119 from Chinese Patent Application No. 201010162682.8 filed Apr. 30, 2010, the entire contents of which are incorporated by reference herein.

BACKGROUND OF THE INVENTION

1. Field of the Invention

The present invention generally related to integrated circuit design. More particularly, the present invention relates to an integrated circuit design method and a design simulation system.

2. Description of the Related Art

As the frequency and size of an integrated circuit increases, the power consumption of the integrated circuit increases. The supply voltage becomes lower and, as a result, power supply noise mitigation for the integrated circuit becomes important in the design. In the integrated circuit design, a suitable design method is needed to guarantee stability of the chip voltage. In an integrated circuit, without taking the power supply decoupling design into consideration, design specification can not be met if power supply noise is excessive.

Figure 1:
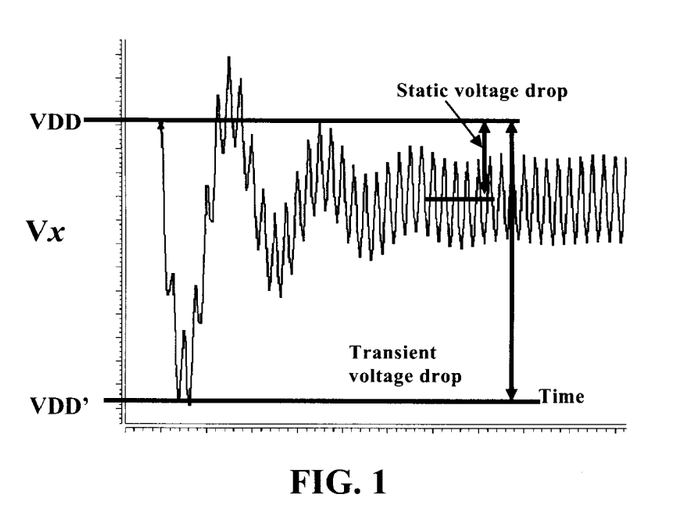
FIG. 1 shows a waveform Vx of an operating voltage versus time, of devices inside an integrated circuit, and parameters characterizing noise of the power supply.

In actual applications, the operating voltage of the devices inside the integrated circuit fluctuated. Those skilled in the art also say that the voltage of the devices has noise and is unstable. FIG. 1 shows a waveform Vx of an operating voltage versus time of the devices inside an integrated circuit and power noise characteristics including: VDD which is a power supply terminal of the chip; VDD' which is a minimum voltage of the devices inside the ship; Static IR drop which is a difference between the voltage of power supply terminal and an average voltage when the devices inside the chip operate stably and which is caused mainly by parasitic resistance in a power supply network; and Transient Voltage drop which is a difference between the voltage of power supply terminal and VDD', ranging from scored of millivolts to hundreds of millivolts, characterizing a state of an initial charging process of the power supply network and determined collectively by capacitors and inductors in the network, wherein the chip has difference requirements on Transient Voltage drop for different applications.

In general, the voltage fluctuation is reduced by increasing decoupling capacitors. The decoupling capacitors can avoid a voltage drop due to a sudden change of current, thereby adapting to the change in current of the drive circuit.

Generally, the number of decoupling capacitors is evaluated at the late stage of chip design. If the number is insufficient, the number shall be increased and/or the chip layout shall be re-adjusted, which brings inflexibility to the design.

SUMMARY OF THE INVENTION

The existing decoupling technology generally is not targeted at optimizing the chip area. Chip size is a key factor to total cost. Therefore, an effective integrated circuit decoupling design method is required and a simulation system by use of which stability of the designated chip voltage can be improved rapidly and effectively. The area of the integrated circuit and the design period can be reduced while meeting the design requirements.

According to an aspect of the present invention, an integrated circuit design method is provided, including: determining a region in which power supply noise shall be analyzed, an initial area of the region and a number of initial decoupling capacitors to be used; determining current model parameters of the region; determining model parameters of a power supply network model corresponding to the initial area of the region; inputting into a simulator a net list of the region, the initial area of the region, the number of initial decoupling capacitors to be used by the region, current model parameters of the region, and model parameters of the power supply network model of the region, to obtain a simulation result; judging, based on the simulation result, whether or not the region satisfies noise requirements of a chip power supply, under the initial area of the region and the number of initial decoupling capacitors to be used by the region; and if the region satisfies noise requirements of the chip power supply, determining that the initial area is a minimum area that satisfies the noise requirements of the chip power supply in a case where the region uses the number of initial decoupling capacitors.

According to another aspect of the present invention, an integrated circuit design system is provided, including: a first determining means configured to determine a region in which power supply noise shall be analyzed, an initial area of the region and a number of initial decoupling capacitors to be used; a second determining means configured to determine current model parameters of the region; a third determining means configured to determine model parameters of a power supply network model corresponding to the initial area of the region; simulating means configured to input into a simulator a net list of the region, the initial area of the region, the number of initial decoupling capacitors to be used by the region, current model parameters of the region, and model parameters of the power supply network model of the region, to obtain a simulation result; a first judging means configured to judge, based on the simulation result, whether or not the region satisfies noise requirements of a chip power supply, under the initial area of the region and the number of initial decoupling capacitors to be used by the region; and a fourth determining means configured to, if the region satisfies noise requirements of the chip power supply, determine that the initial area is a minimum area that satisfies the noise requirements of the chip power supply in case the initial number of decoupling capacitors are sued in the region.

BRIEF DESCRIPTION OF THE DRAWINGS

The above and other object, features and advantages of the present invention will be more apparent by describing in detail exemplary embodiments of the present invention in combination with the accompanying drawings, wherein same reference signs denote the same composite parts in the exemplary embodiments.

DETAILED DESCRIPTION OF THE PREFERRED EMBODIMENTS

The preferred embodiments of the present invention shown in the accompanying drawings will be described in detail below with reference to the accompanying drawings. However, the present invention can be implemented in various forms and are not limited by the embodiments illustrated here. On the contrary, the embodiments are provided to make the present invention more thorough and complete and to convey the scope of the present invention to those skilled in the art.

Some basic concepts are indicated for the convenience of the description of the present invention later.

Figure 2:
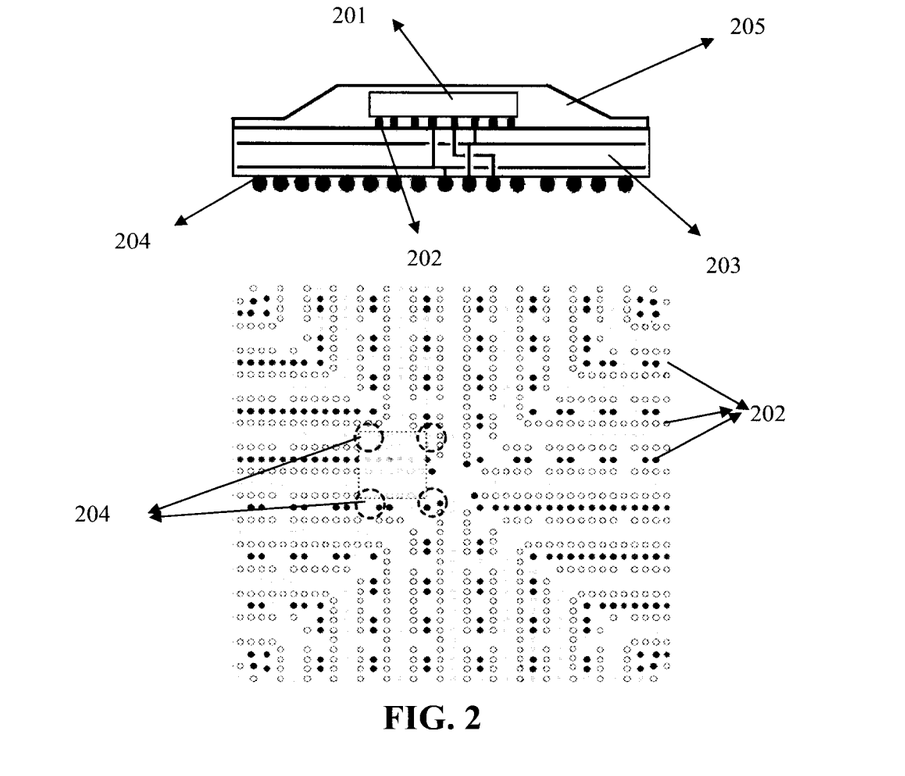
FIG. 2 illustratively shows a cross section of an integrated circuit with a package and a plan view of all solder bumps on the integrated circuit.

FIG. 2 illustratively shows a cross section of an integrated circuit with a package and a plan view of all solder bumps on the integrated circuit, wherein: 201 denotes a die, which is called DIE by those skilled in the art; 202 denotes a solder bump on the DIE; 203 denotes a package of the chip; 204 denotes a solder ball on the package, wherein the solder bump is connected to the solder ball via an internal wiring and one or more solder bumps of the same property correspond to one or more solder balls; and 205 denotes a lid of the chip, which is called LID by those skilled in the art.

In the existing integrated circuit design simulator such as HSPICE and PSPICE, it is enough for the designer to provide a net list required by the simulator to perform on the devices accurate simulation, analysis and optimization in the level of transistor in a high frequency range. In such a situation, the net list mainly describes connection relations and simulation conditions of circuit elements. In actual applications, the simulation software can provide critical circuit simulation and design solutions. When the simulation software is utilized for circuit simulation, the circuit scale only depends on an actual memory capacity of the user computer.

Figure 3:
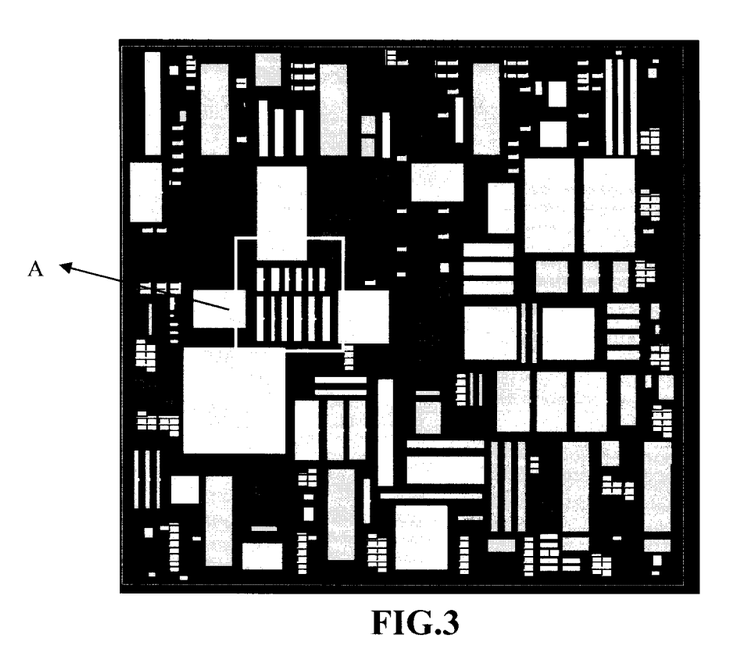
FIG. 3 shows an internal structure of the integrated circuit.

FIG. 3 shows an internal structure of the integrated circuit in which a rectangular block represents a device of the chip. In integrated circuit design, in order to simulate the circuit structure, much information of each device is stored in a device database for the convenience of simulation invocation. This information includes device size, process parameters, operating frequency, current waveform, for example. The device database will be used later in the process of carrying out the present invention.

The power supply system of the integrated circuits consists of an external power supply, a package, an on-chip power rail (connecting resistor, inductor and capacitor network) and a gate device. The external power supply may be equivalent to a stable voltage source. The package and the on-chip power rail may be equivalent to a power supply network model connecting the resistor, inductor and capacitor network. The gate device may be equivalent to a current source.

Power supply noise analysis may be made in the whole region of the whole chip of the integrated circuit or a part of the region, for example, power supply noise analysis may be made in the area A denoted by a white block in FIG. 3. In a chip where the devices are placed initially and are not connected, a power supply network model and a current model may be created for the power supply network in a region where noise of the power supply shall be analyzed. The power supply network model will vary with the area of the region where noise of the power supply shall be analyzed. The current model is related to the devices contained in the region where noise of the power supply shall be analyzed. Then, model parameters of the power supply network model and the current model are inputted to the integrated circuit simulator. The existing integrated circuit design simulator, such as HSPICE and PSPICE, can simulate the operating status of the circuit by use of the created power supply network model and current model. It can further determine from the simulation result whether or not the power supply noise of the power supply network model and the current model under the area of the region satisfies the requirements.

Figure 4:
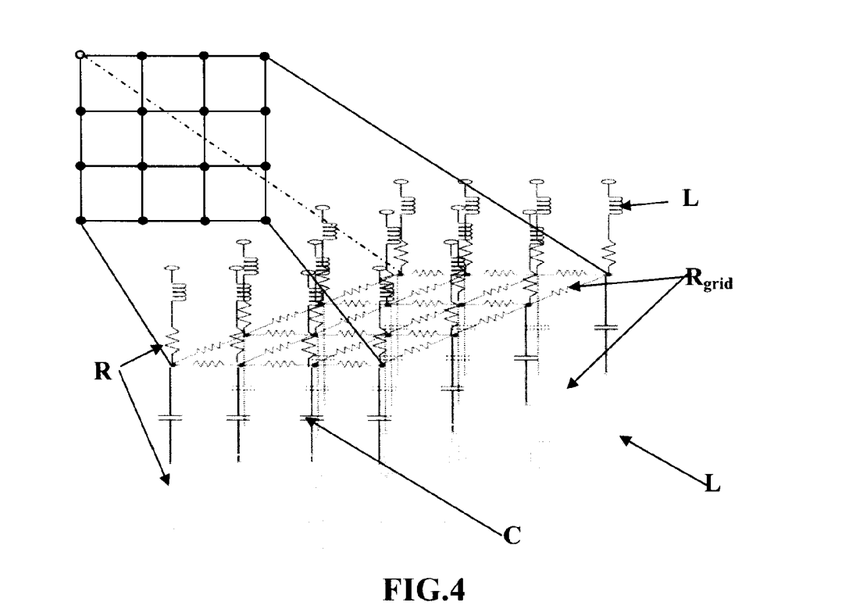
FIG. 4 shows a power supply network model and a current model in a region proposed by the present invention.

Those skilled in the art know that there are many power supply network models and current models that can be applied to the present invention. FIG. 4 shows a power supply network model in a region proposed by the invention. In FIG. 4, the current model in the whole region of the chip or a part thereof can use a square or rectangular network. The square network is used for description below for sake of simplicity. Those skilled in the art know that the same applies to a rectangular model structure. In the current mode, the region is split into $(N-1) \times (N-1)$ sub-regions with the same size by $N \times N$ nodes ($4 \times 4$ in FIG. 4 for example), where N is a number of nodes in each side of the region. A total current of the region can be evaluated according to the devices in the region. For example, before the layout of the integrated circuit is finished, one can pre-evaluate which devices exist in the region, extract current waveforms in a cycle of the devices automatically from the device database according to the names of the devices, and repeat it according to their respective operating frequencies. Finally, currents of all the devices are superimposed to obtain a total current waveform of the region. Other existing technologies can be used for obtaining the total current waveform of the region, for example, HSPICE or PSPICE simulator may be used for extracting the current waveform of the device.

In a node current assigning mode, the total current in the region to be simulated is directly averaged to the nodes. For an $N \times N$ node network, the current of each node is the same and is one to $N \times N$ of the total current.

Figure 5:
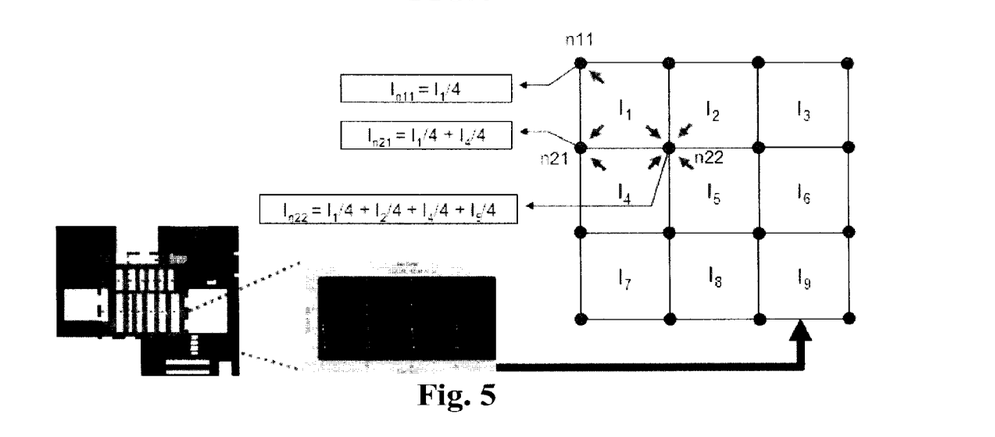
FIG. 5 is schematic diagram showing creation of a node current in another current assigning mode.

In another node current assigning mode, because the power supply network physically is uniform in general, the current supplied to each device is approximately regarded as uniform in the whole region. That is, the current is averagely assigned to each sub-region. Assuming that the total current of the region is $I_{total}$ and the currents of the sub-regions are $I_1$ through $I_{(n-1) \times (n-1)}$, then the current of each sub-region is $I_i = I_{total}/[(N-1) \times (N-1)]$. By taking a $3 \times 3$ grid model in FIG. 4 as an example, as shown in FIG. 4, there are nine sub-regions. Assuming that the current of each sub-region is uniform, the current of each sub-region is obtained by using $I_{grid} = I_{total}/9$. FIG. 5 is a schematic diagram showing creation of a node current in another current assigning mode. By taking N=4 as an example, the current $I_{grid}$ of each region will finally flow to nodes in the four corners. Therefore, by taking the current of each corner for consideration separately, it is ¼ of the current of the region. Therefore, for $n_{11}$, only ¼ of $I_1$ is supplied to the node, so $I_{n11} = I_1/4$. For a node $n_{21}$ on a side, the current thereof is equal to a sum of $I_1$ and $I_2$, that is, $I_{n21} = I_1/4 + I_4/4$. For an internal node $n_{22}$, $I_{22} = I_1/4 + I_2/4 + I_4/4 + I_5/4$. For a (N−1)×(N−

1) grid, the current of any node is a sum of ¼ currents of the sub-regions in the corners of the node.

Corresponding to the above mentioned current model, the power supply network model of the whole region of the chip or a part thereof can be simulated by a power supply network model consisting of a package resister (R), a package inductor (L), an on chip resistor ($R_{grid}$) and an on node capacitor (C), which is shown in FIG. 4. Specifically, the model includes 2×N×N package parasitic resistors R, 2×N×N package inductors L, 4×N×(N−1) on chip resistors $R_{grid}$, and N×N on node capacitors C.

Value of the package resistor R: Assuming that $R_0$ is a parasitic resistance value of each solder bump, the data can be obtained from a process base. The process data is different from the device database and mainly includes information on parasitic parameters in the process and manufacture. Nc is a number of solder bumps of VDD or GND in the region, wherein $F=N^2/Nc$ is a converting coefficient, then $R=R_0 \times F$ represents the package parasitic resistance of each node in the modeling region.

Value of the package inductor L: Assuming that $L_0$ is inductance of each sold bump, the data can be obtained form the process base, then $L=L_0 \times F$ represents parasitic inductance of each node in the modeling region.

Value of on chip resistor $R_{grid}$: A parasitic resistance also exists between every two nodes, $R_{grid}=R_1 \times L$, wherein $R_1$ is a process resistance parameter in a unit length, L represents an actual physical length between the two nodes, and $L^2$=the area of the region/[n−1)(N−1)].

Value of on node capacitor C: The capacitor is (Cdecap+Cmacro+Cbk)/$N^2$, where Cdecap is a capacitance value of the decoupling capacitors applied to the region, Cmacro is a capacitance value of the intrinsic capacitance of the devices in the region, and Cbk is a capacitance value of a background capacitor. Specifically, the capacitance values are calculated as follows:

Cdecap=n×(the area of the region−the area occupied by the devices)×$C_0$, where n is a ratio of the area of the decoupling capacitors to the area of the region other than the area occupied by the devices, and $C_0$ is the capacitance density of a single decoupling capacitor.

Cbk=(1−n)×(the area of the region−the area occupied by the devices)×$C_b$, where $C_b$ is the background capacitance density.

The capacitance value Cmacro of the intrinsic capacitor of the devices in the region, the capacitance density $C_0$ of the decoupling capacitors, the background capacitance density $C_b$, the process resistance parameter $R_1$ in a unit length, the parasitic resistance value $R_0$ of each solder bump and the inductance $L_0$ of each solder bump, all come from the process parameter base and are provided by the chip manufacturer.

Figure 6:
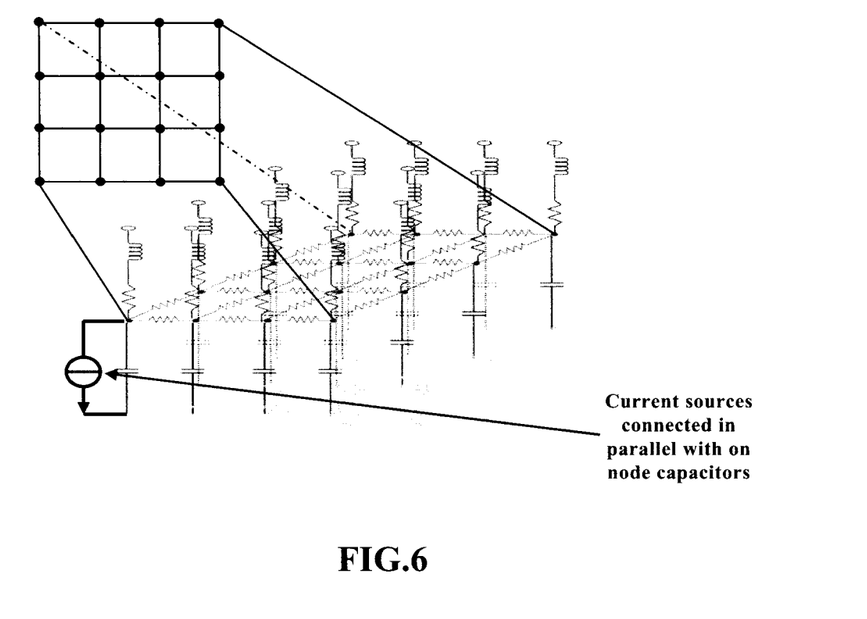
FIG. 6 shows an insertion mode of the node current in simulation.

FIG. 6 shows an insertion mode of the node current in simulation. Then in FIG. 6, there are N×N node currents corresponding to N×N current sources and connected in parallel with the on node capacitors.

Other power supply network models and current models also apply to the invention.

There are other current models; for example, not using virtual nodes but using solder bumps in the region as current models of the node. The node current can split the current of the region in average or accurately modeling the elements and simulating the IP model by using a spice simulator to thereby extract currents at different positions in the modeling region. Compared with the above methods, the current model proposed by the present invention can plan decoupling policies in the initial phase of the design to thereby shorten the design period.

There are also many kinds of other power supply network models, which can be divided by dimension into one-dimensional, two-dimensional, and three-dimensional.

1) one-dimensional: The one-dimensional model is comparatively simple and generally consists of an on chip RC parameter, a package one-dimensional RLC parameter, and a PCB plate one-dimensional RLC parameter. The method has poor accuracy and thus is generally used for evaluating the overall resonance situation of the chip or evaluating the overall decoupling capacitor.

2) two-dimensional: The above power supply network model of the invention is a two-dimensional model. Other two-dimensional models include, for example, modified node approach (MNA), or partial equivalent electrical circuit (PEEC), which are algorithms for fixed circuit models. The various parameters in the circuit model can be obtained through mathematical calculation.

3) three-dimensional: The three-dimensional model has comparatively accurate algorithms at the cost of consumption of a great deal of computing resources. Currently, the popular three-dimensional modeling techniques mainly include: finite element method (FEM), finite differential method in time domain (FDTD), finite integration technique (FIT) and moment method (MOM). They can also be applied to the present invention.

Figure 7:
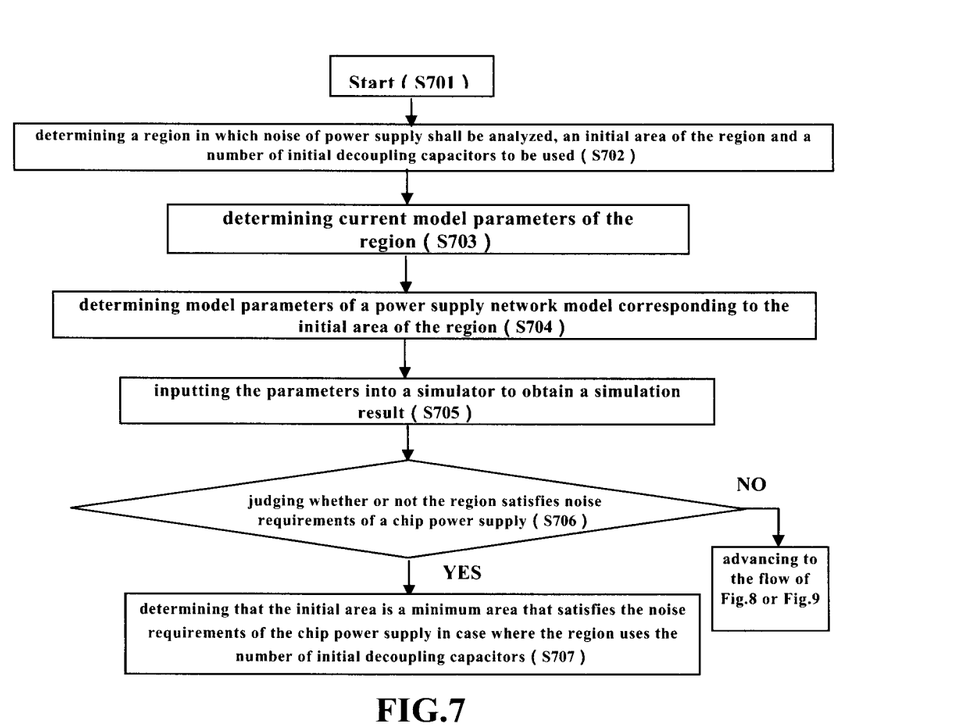
FIG. 7 illustratively shows a flow chart of an integrated circuit design method according to an embodiment of the present invention.

For the region in which noise of the power supply is to be examined, parameters of the model in the region can be obtained. The region is simulated according to the determined minimum initial area of the region and the number of the initial decoupling capacitors to be used. The object of simulation is to obtain the minimum area that satisfies the noise requirements of the power supply in case where the region uses an appropriate number of decoupling capacitors. FIG. 7 illustratively shows a flow chart of an integrated circuit design method according to an embodiment of the invention.

As shown in FIG. 7, the method includes: step S702 determining the region in which noise of the power supply shall be analyzed, an initial area of the region and a number of initial decoupling capacitors to be used; step S703 determining current model parameters of the region; step S704 determining model parameters of the power supply network model corresponding to the initial area of the region; step S705 inputting into the simulator a net list of the region, the initial area of the region, the number of the initial decoupling capacitors to be used by the region, current model parameters of the region, and the model parameters of the power supply network model of the region, to obtain a simulation result; step S706 judging from the simulation result whether or not the region satisfies the noise requirements of the chip power supply under the initial area of the region and the number of the initial decoupling capacitors in the region; and step S707 for, if the region satisfies the noise requirements of the chip power supply, determining that the initial area of the region is the minimum area that satisfies the noise requirements of the chip power supply in case there the region uses the number of initial decoupling capacitors, wherein steps S703 and S704 are not specifically ordered and can be executed subsequently to each other or in parallel to each other.

Judging from the simulation result whether or not the region satisfies the noise requirement of the chip power supply under the initial area of the region includes judging if a transient voltage drop of the region satisfies the requirements.

As the present invention wishes to obtain the minimum area of the region in a case where the noise requirements of the chip power supply are satisfied, if it is judged that the noise requirements of the chip power supply are not satisfied, in an embodiment, the number of the decoupling capacitors is increased and simulated. When the number of the decoupling capacitors increases to a threshold and the noise requirements of the chip power supply still are not satisfied, the area of the region is increased by a prescribed value and simulation is performed again until the minimum area that satisfied the noise requirements of the chip power supply is obtained. In another embodiment, the number of decoupling capacitors may be fixed, the area of the region gradually increased and a model is created for simulation to thereby obtain the minimum area that satisfied the noise requirements of the chip power supply.

Figure 8:
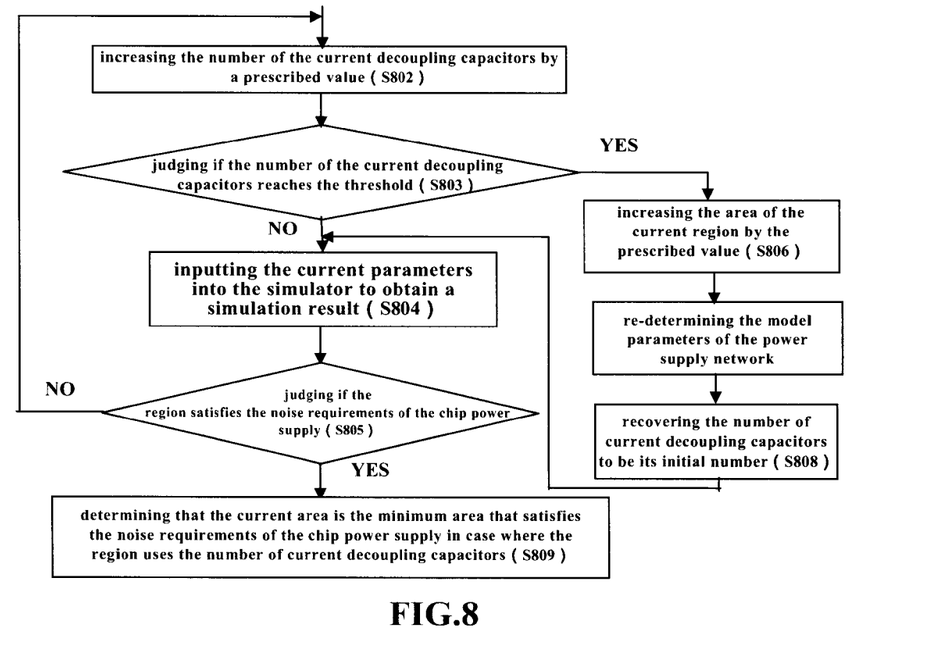
FIG. 8 is a flow chart showing a preferred method when it is judged in step S706 of FIG. 7 that the region does not satisfy the noise requirements of the chip power supply.
Figure 9:
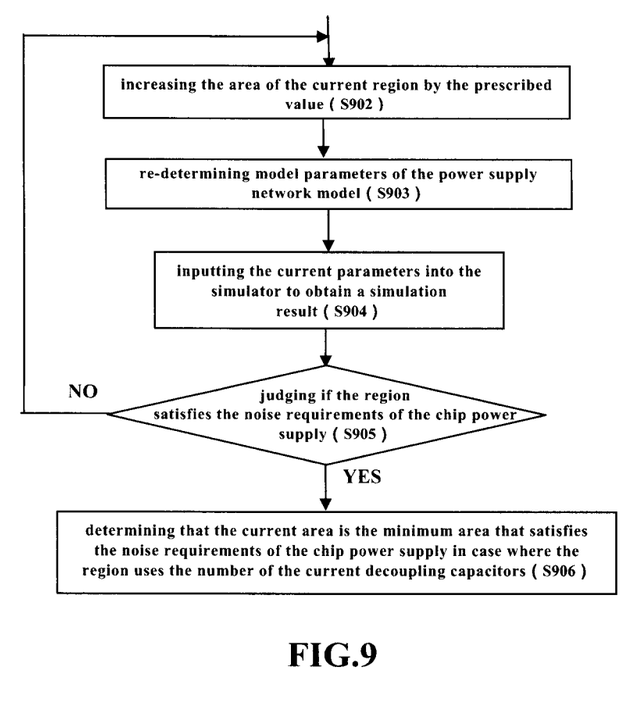
FIG. 9 is a flow chart showing another preferred method when it is judged in step S706 of FIG. 7 that the region does not satisfy the noise requirements of the chip power supply.

FIGS. 8 and 9, respectively describe flows of the two embodiments. Here, the threshold for the number of the decoupling capacitors may be artificially specified or calculated according to the area of the region, the area occupied by the devices in the region and the area occupied by a single decoupling capacitor. Specifically, the threshold for the number of the decoupling capacitors is (the area of the region–the area of the devices in the region)/the area occupied by a single decoupling capacitor. In addition, the prescribed value for the increment of the area is an area increased once, and the magnitude of the prescribed value is relevant to a characteristic size of the solder bump. Thus, the area can be increased gradually to thereby obtain the minimum area that satisfies the noise requirements of the chip power supply.

FIG. 8 shows a flow chart of a preferred method when it is judged in step S706 of FIG. 7 that the region does not satisfy the noise requirements of the chip power supply. According to FIG. 8, when it is judged in step S706 that the region does not satisfy the noise requirements of the chip power supply under the current area, in step S802, using the number of the initial decoupling capacitors to be used by the region as an initial value of the number of the current decoupling capacitors, increasing the number of the current decoupling capacitors by a prescribed value, which may be prescribed by the designer, for example, being 1 in the simplest case. Then, in step S803 judging if the number of the current decoupling capacitors reaches the threshold. If the number does not reach the threshold, in step S804, inputting into the simulator the current region, the area of the current region, the number of the current decoupling capacitors, the current model parameters, and the model parameters of the power supply network model to obtain a simulation result.

In step S805, judging if the region satisfies the noise requirements of the chip power supply under the area of the current region and the number of the current decoupling capacitor. If it is judged that the noise requirements of the chip power supply can be satisfied, then in step S809, determining that the current area is the minimum area that satisfies the noise requirements of the chip power supply in a case where the region uses the number of current decoupling capacitors. If it is judged that the noise requirements of the chip power supply cannot be satisfied, returning to step S802 to continue to increase the number of the current decoupling capacitors. If it is judged in S803 that the number of current decoupling capacitors reaches the threshold, then in step S806, using the initial area to be used by the region as the initial value of the area of the current region and increasing the area of the current region by the prescribed value.

In step S807, re-determining the model parameters of the power supply network model corresponding to the area of current region, here the current model will not be changed with the increase in the number of the current decoupling numbers because the decoupling capacitor device does not make a contribution to the current in the region. In step S808, recovering the number of current decoupling capacitors to be its initial number. Then returning to step S804 to continue subsequent steps.

FIG. 9 shows a flow chart of another preferred method when it is judged in step S706 of FIG. 7 that the region does not satisfy the noise requirements of the chip power supply, wherein the number of current decoupling capacitors is a fixed value. According to FIG. 9, in step S902, using the initial area of the region as the initial value of the area of the current region and increasing the area of the current region by the prescribed value. Then in step S903, re-determining model parameters of the power supply network model corresponding to the area of the current region. In step S904, inputting into the simulator the current region, the area of the current region, the number of the current decoupling capacitors, the current model parameters, and the model parameters of the power supply network model to obtain a simulation result.

Then in step S905, judging if the region satisfies the noise requirements of the chip power supply under the area of the current region and the number of the current decoupling capacitor. If it is judged that the noise requirements of the chip power supply can be satisfied, then in step S906, determining that the current area is the minimum area that satisfies the noise requirements of the chip power supply in a case where the region uses the number of the current decoupling capacitors. If it is judged in step S905 that the noise requirements of the chip power supply cannot be satisfied, returning to step S902 to continue to increase the area of the current region.

Figure 10:
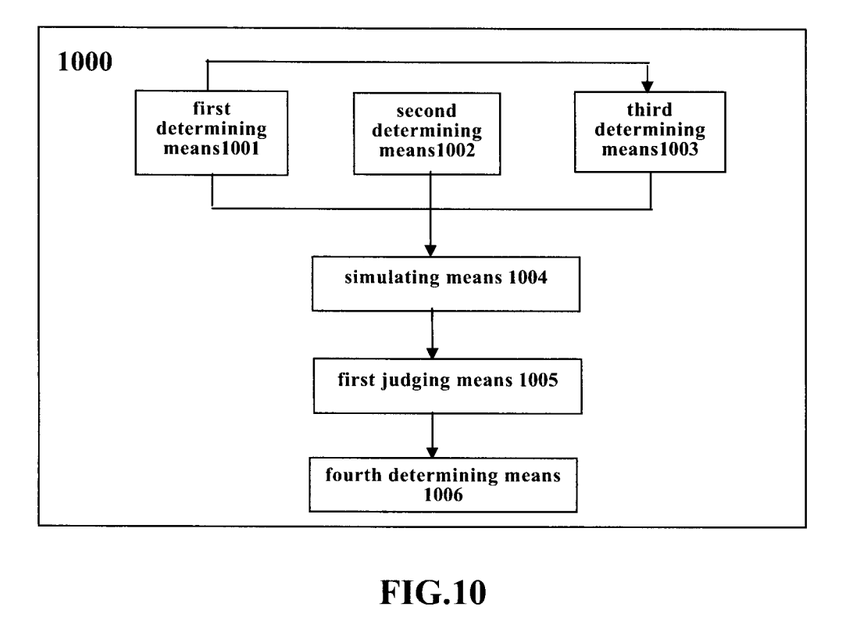
FIG. 10 illustratively shows a block diagram of an integrated circuit design system 1000 according to an embodiment of the present invention.

Under the same inventive concept the present invention further discloses an integrated circuit design system. FIG. 10 illustratively shows a block diagram of an integrated circuit design system 1000 according to an embodiment of the present invention. According to FIG. 10, system 1000 includes: a first determining means 1001 configured to determine a region in which power supply noise shall be analyzed, an in initial area of the region and a number of initial decoupling capacitors to be used; a second determining means 1002 configured to determine current model parameters of the region; a third determining means 1003 configured to determine model parameters of a power supply network model corresponding to the initial area of the region; simulating means 1004 configured to input into a simulator a net list of the region, the initial area of the region, the number of initial decoupling capacitors to be used by the region, current model parameters of the region, and model parameters of the power supply network model of the region, to obtain a simulation result; a first judging means 1005 configured to judge, based on the simulation result, whether or not the region satisfies noise requirements of a chip power supply, under the initial area of the region and the number of initial decoupling capacitors to be used by the region; and a fourth determining means 1006 configured to, if the region satisfies noise requirements of the chip power supply, determine that the initial area is a minimum area that satisfies the noise requirements of the chip power supply in case the initial number of decoupling capacitors are used in the region.

In an embodiment, the system 1000 further includes (not shown in FIG. 10): a decoupling capacitor manager configured to, if the region does not satisfy the noise requirements of the chip power supply, use the number of the initial decoupling capacitors to be used by the region as an initial value of the number of the current decoupling capacitors, increasing the number of the current decoupling capacitors by a prescribed value, and judging if the number of the current decoupling reaches the threshold, wherein if the decoupling capacitor manager judges that the number of the current decoupling capacitors does not reach the threshold, the simulating means inputs into the simulator the current region, the area of the current region, the number of the current decoupling capacitors, the current model parameters, and the model parameters of the power supply network model to obtain a simulation result; the first judging means judges if the region satisfies the noise requirements of the chip power supply under the area of the current region and the number of the current decoupling capacitor; wherein if the first judging means judges that the noise requirements of the chip power supply can be satisfied, the fourth determining means determines that the current area is the minimum area that satisfies the noise requirements of the chip power supply in case where the region uses the number of current decoupling capacitors; if the first judging means judges that the noise requirements of the chip power supply cannot be satisfied, the decoupling capacitor manager continues to increase the number of the current decoupling capacitors by a prescribed value and continues to make judgment.

In another embodiment, the system 1000 further includes (not shown in FIG. 10): a region area manager configured to, if the decoupling capacitor manager judges that the number of the current decoupling capacitors reaches the threshold, use the initial area of the region as the initial value of the area of the current region and increasing the area of the current region by the prescribed value; wherein the third determining means re-determines the model parameters of the power supply network model corresponding to the area of current region, the decoupling capacitor manager recovers the number of the current decoupling capacitors to be its initial number, the simulating means inputs into the simulator the current region, the area of the current region, the number of the current decoupling capacitors, the current model parameters, and the model parameters of the power supply network model to obtain a simulation result, and the first judging means continues to make judgment.

In further another embodiments, the system 1000 further includes (not shown in FIG. 10): a region area manager configured to, if the decoupling capacitor manager judges that the number of the current decoupling capacitors reaches the threshold, use the initial area of the region as the initial value of the area of the current region and increasing the area of the current region by the prescribed value; wherein the third determining means re-determines the model parameters of the power supply network model corresponding to the area of current region, the simulating means inputs into the simulator the current region, the area of the current region, the number of the current decoupling capacitors, the current model parameters, and the model parameters of the power supply network model to obtain a simulation result and the first judging means judges whether or not the region satisfies the noise requirements of the chip power supply under the area of the current region and the number of the current decoupling capacitors; wherein, if the first judging means judges that the noise requirements of the chip power supply can be satisfied, the fourth determining means determines that the current area is the minimum area that satisfies the noise requirements of the chip power supply in case where the region uses the number of current decoupling capacitors; if the first judging means judges that the noise requirements of the chip power supply are not satisfied, the region area manager continues to increase the area of the current region by the prescribed value, and the third determining means, the simulating means, the first judging means, and the fourth determining means continue to perform operations.

In the system, the first judging means judges whether or not the region satisfies the noise requirements of the chip power supply under the area of the region and the number of the decoupling capacitors, by judging whether or not the transient voltage drop of the region satisfies the requirements, wherein the threshold for the number of the decoupling capacitors may be determined by one of the following methods: (1) artificially specified; and (2) calculated according to the area of the region, the area occupied by the devices in the region and the area occupied by a single decoupling capacitor, wherein the prescribed value for increment of the area is relevant to the characteristic size of the solder bump. In the current model of the invention, the region is split by N×N nodes into (N−1)×(N−1) sub-regions of the same size, and a total current of the region can be evaluated according to the devices in the region, where N is a number of nodes in each side of the region. The node current assignment includes at least one of the following: (1 averaging the total current of the region into the nodes; and (2) averaging the total current of the region into each sub-region, wherein the current of any node is a sum of ¼ currents of the sub-regions in the corners of the node. The power supply network model of the invention includes 2×N×N package parasitic resistors, 2×N×N package inductors, 4×N×(N−1) on chip resistors, and N×N on node capacitors C. Specific embodiments have been described in the method and thus are omitted here.

Under the same inventive concept, the present invention further discloses an integrated circuit simulator for simulation as described above.

Although the exemplary embodiments of the invention have been described with reference to the accompanying drawings, it should be appreciated that, the invention is not limited to the exact embodiments, and various changes and modifications may be made by those skilled in the art to the embodiments without departing from the scope and spirit of the invention. All these changes and modifications are intended to be included in the scope of the invention as defined by the attached claims.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in any tangible medium of expression having computer usable program code embodied therein.

Any combination of one or more computer usable or computer readable medium(s) may be utilized. The computer usable or computer readable medium may be, for example, but not limited to, an electronic, magnetic, optical, electromagnetic, infrared, or semiconductor system, apparatus, device, or propagation medium. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission medium supporting for example the Internet or Intranet, or a magnetic storage device. Note that the computer usable or computer readable medium even may be paper or other suitable medium on which programs are printed, and this is because the programs can be obtained electronically by electrically scanning the paper or other medium, and then be compiled, interpreted or processed appropriately, and be stored in a computer memory if necessary. In the context of this document, a computer usable or computer readable storage medium may be any medium that contains, stores, communicated, propagates, or transmits a program for use by or in connection with an instruction execution system, apparatus or device. A computer useable medium may include a data signal with computer usable program code embodied therein, propagated in baseband or as an art of a carrier wave. The computer usable program code may be transmitted using any appropriate medium, including but not limited to wireless, wireline, optical fiber cable, RF, etc.

Computer program code for carrying out operations for aspects of the present invention may be written in any combination of one or more programming languages, including an object oriented programming language such as Java, Smalltalk, C++ or the like and convention procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) r a wide area network (WAN), or the connection may be made to an external computer (for example, through the Internet using an Internet Service Provider).

Furthermore, each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the computer or other programmable data processing apparatus, create means for implementing the functions/acts specified in the blocks of the flowchart illustrations and/or block diagrams.

These computer program instructions may also be stored in a computer readable medium that can direct a computer or other programmable data processing apparatus to function in a particular manner, such that the instructions stored in the computer readable medium produce an article of manufacture including instruction means which implement the functions/acts specified in the blocks of the flowchart illustrations and/or block diagrams.

The computer program instruction may also be loaded onto a computer or other programmable data processing apparatus to cause a series of operational steps to be performed on the computer or other programmable data processing apparatus to produce a computer implemented process such that the instructions which execute on the computer or other programmable apparatus provide for implementing the functions/acts specified in the blocks of the flowchart illustrations and/or block diagrams.

The flowchart illustrations and block diagrams in the figures illustrate the architecture, functionality, and operation of possible implementations of systems, methods and computer program products according to various embodiments of the present invention. In this regard, each block in the flowchart illustrations or block diagrams may represent a module, program segment, or portion of code, which includes one or more executable instructions for implementing the specified logical function(s). It should also be noted that, in some3alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

What is claimed is:

1. An integrated circuit design method, comprising:
    determining a region in which power supply noise shall be analyzed, an initial area of the region and a number of initial decoupling capacitors to be used;
    determining current model parameters of the region;
    determining model parameters of a power supply network model corresponding to the initial area of the region;
    inputting into a simulator a net list of the region, the initial area of the region, the number of initial decoupling capacitors to be used by the region, current model parameters of the region, and model parameters of the power supply network model of the region, to obtain a simulation result;
    judging, based on the simulation result, whether or not the region satisfies noise requirements of a chip power supply, under the initial area of the region and the number of initial decoupling capacitors to be used by the region; and
    determining that the initial area is a minimum area that satisfies the noise requirements of the chip power supply in a case where the region uses the number of initial decoupling capacitors if the region satisfies noise requirements of the chip power supply, and further comprising:
    (i) in a case where region does not satisfy the noise requirements of the chip power supply, using the number of the initial decoupling capacitors to be used by the region as an initial value of the number of the current decoupling capacitors, increasing the number of the current decoupling capacitors by a prescribed value;
    judging if the number of the current decoupling capacitors reaches a threshold, wherein in a case where the number of the current decoupling capacitors does not reach the threshold, inputting into the simulator the current region, the area of the current region, the number of the current decoupling capacitors, the current model parameters, and the model parameters of the power supply network model to obtain a simulation result;
    judging if the region satisfies the noise requirements of the chip power supply under the area of the current region and the number of the current decoupling capacitors;
    determining that the current area is the minimum area that satisfies the noise requirements of the chip power supply in a case where the region uses the number of current decoupling capacitors when judging that the noise requirements of the chip power supply cannot be satisfied;
    returning to the step of increasing the number of the current decoupling capacitors by a prescribed value, when judging that the noise requirements of the chip power supply cannot be satisfied, and
    (ii) in a case where the number of the current decoupling capacitors reaches the threshold,
    using the initial area of the region as the initial value of the area of the current region and increasing the area of the current region by a prescribed value;

re-determining the model parameters of the power supply
network model corresponding to the area of the current
region;
recovering the number of the current decoupling capacitors
to be its initial number;
returning to the step of inputting into the simulator the
current region, the area of the current region, the number
of the current decoupling capacitors, the current model
parameters, and the model parameters of the power supply network model to obtain a simulation result, and
judging if the region satisfies the noise requirements of the
chip power supply under the area of the current region
and the number of the current decoupling capacitors;
determining that the current area is the minimum area that
satisfies the noise requirements of the chip power supply
in a case where the region uses the number of current
decoupling capacitors when judging that the noise
requirements of the chip power supply are satisfied; and
returning to the step of increasing the number of the current
decoupling capacitors by a prescribed value, when judging that the noise requirements of the chip power supply
cannot be satisfied.

2. The method according to claim 1, further comprising:
in the case where the region does not satisfy the noise
requirements of the chip power supply,
using the initial area of the region as the initial value of the
area of the current region and increasing the area of the
current region by the prescribed value;
re-determining the model parameters of the power supply
network model corresponding to the area of the current
region;
inputting into the simulator the current region, the area of
the current region, the number of the current decoupling
capacitors, the current model parameters, and the model
parameters of the power supply network model to obtain
a simulation result;
judging whether or not the region satisfies the noise
requirements of the chip power supply under the area of
the current region and the number of the current decoupling capacitors;
determining that the current area is the minimum area that
satisfies the noise requirements of the chip power supply
in a case where the region uses the number of current
decoupling capacitors, when judging that the noise
requirements of the chip power supply are satisfied; and
returning to the step of increasing the area of the current
region by the prescribed value and continuing subsequent steps when judging that the noise requirements of
the chip power supply are not satisfied.

3. The method according to claim 1, wherein judging
whether or not the region satisfies the noise requirements of
the chip power supply under the area of the region and the
number of the decoupling capacitors comprises judging
whether or not a transient voltage drop of the region satisfies
the requirements.

4. The method according to claim 1, wherein the threshold
for the number of the decoupling capacitors is calculated
according to the area of the region, the area occupied by the
devices in the region and the area occupied by a single decoupling capacitor.

5. The method according to claim 1, wherein the prescribed
value for increment of the area is relevant to a characteristic
size of solder bump.

6. The method according to claim 1, wherein in the current
model, the region is split by N×N nodes into (N−1)×(N−1)
sub-regions of the same size, a total current of the region is
evaluated according to the devices in the region, and a node
current assignment is averaging the total current of the region
into the nodes, where N is a number of nodes in each side of
the region.

7. The method according to claim 6, wherein the power
supply network model comprises 2×N×N package parasitic
resistors, 2×N×N package inductors, 4×N×(N−1) on chip
resistors, and N×N on node capacitors C.

8. The method according to claim 1, wherein in the current
model, the region is split by N×N nodes into (N−1)×(N−1)
sub-regions of the same size, a total current of the region is
evaluated according to the devices in the region, and a node
current assignment is averaging the total current of the region
into each sub-region, wherein the current of any node is a sum
of ¼ currents of the sub-regions in the corners of the node,
where N is a number of nodes in each side of the region.

9. An integrated circuit simulator for simulating by use of
the method according to claim 1.

10. An integrated circuit design system, comprising:
a first determining means configured to determine a region
in which power supply noise shall be analyzed, an initial
area of the region and a number of initial decoupling
capacitors to be used;
a second determining means configured to determine current model parameters of the region;
a third determining means configured to determine model
parameters of a power supply network model corresponding to the initial area of the region;
simulating means configured to input into a simulator a net
list of the region, the initial area of the region, the number of initial decoupling capacitors to be used by the
region, current model parameters of the region, and
model parameters of the power supply network model of
the region, to obtain a simulation result;
a first judging means configured to judge, based on the
simulation result, whether or not the region satisfies
noise requirements of a chip power supply, under the
initial area of the region and the number of initial decoupling capacitors to be used by the region; and
a fourth determining means configured to determine that
the initial area is a minimum area that satisfies the noise
requirements of the chip power supply in case the initial
number of decoupling capacitors are used in the region
when the region satisfies noise requirements of the chip
power supply;
a decoupling capacitor manager configured to use the number of the initial decoupling capacitors to be used by the
region as an initial value of the number of the current
decoupling capacitors, increasing the number of the current decoupling capacitors by a prescribed value and
judging in a case where the number of the current decoupling capacitors reaches a threshold, if the region does
not satisfy the noise requirements of the chip power
supply,
wherein if the decoupling capacitor manager judges that
the number of the current decoupling capacitors does not
reach the threshold,
the simulating means inputs into the simulator the current
region, the area of the current region, the number of the
current decoupling capacitors, the current model parameters, and the model parameters of the power supply
network model to obtain a simulation result; and
the first judging means judges whether or not the region
satisfies the noise requirements of the chip power supply
under the area of the current region and the number of
the current decoupling capacitors, wherein in a case
where the first judging means judges that the noise
requirements of the chip power supply are satisfied, the fourth determining means determines that the current area is the minimum area that satisfies the noise requirements of the chip power supply in a case where the region uses the number of current decoupling capacitors and wherein in a case where the first judging means judges that the noise requirements of the chip power supply cannot be satisfied, the decoupling capacitor manager continues to increase the number of the current decoupling capacitors by a prescribed value and continues to make judgment;

a region area manager configured to use the initial area of the region as the initial value of the area of the current region and increasing the area of the current region by a prescribed value, in the case where the decoupling capacitor manager judges that the number of the current decoupling capacitors reaches the threshold, and wherein the third determining means re-determines the model parameters of the power supply network model corresponding to the area of current region, the decoupling capacitor manager recovers the number of the current decoupling capacitors to be its initial number, the simulating means inputs into the simulator the current region, the area of the current region the number of the current decoupling capacitors, the current model parameters, and the model parameters of the power supply network model to obtain a simulation result, and the first judging means continues to make judgment.

11. The system according to claim 10, further comprising:

a region area manager configured to use the initial area of the region as the initial value of the area of the current region and increasing the area of the current region by the prescribed value, in the case where the decoupling capacitor manager judges that the number of the current decoupling capacitors reaches the threshold, wherein the third determining means re-determines the model parameters of the power supply network model corresponding to the area of the current region of the region, the simulating means inputs into the simulator the current region, the area of the current region, the number of the current decoupling capacitors, the current model parameters, and the model parameters of the power supply network model to obtain a simulation result, and the first judging means judges whether or not the region satisfies the noise requirements of the chip power supply under the area of the current region and the number of the current decoupling capacitors;

wherein, in the case where the first judging means judges that the noise requirements of the chip power supply are satisfied, the fourth determining means determines that the current area is the minimum area that satisfies the noise requirements of the chip power supply in case where the region uses the number of current decoupling capacitors; and wherein, in the case where the first judging means judges that the noise requirements of the chip power supply are not satisfied, the region area manager continues to increase the area of the current region by the prescribed value and the third determining means, the simulating means, the first judging means, and the fourth determining means continue to perform operations.

12. The system according to claim 10, wherein the first judging means judges whether or not the region satisfies the noise requirements of the chip power supply under the area of the region and the number of the decoupling capacitors by judging whether or not a transient voltage drop of the region satisfies the requirements.

13. The system according to claim 10, wherein the threshold for the number of the decoupling capacitors is calculated according to the area of the region, the area occupied by the devices in the region and the area occupied by a single decoupling capacitor.

14. The system according to claim 10, wherein the prescribed value for increment of the area of the region is relevant to a characteristic size of solder bump.

15. The system according to claim 10, wherein in the current model, the region is split by N×N nodes into (N−1)× (N−1) sub-regions of the same size, a total current of the region is evaluated according to the devices in the region, and a node current assignment is averaging the total current of the region into the nodes, where N is a number of nodes in each side of the region.

16. The system according to claim 10, wherein in the current model, the region is split by N×N nodes into (N−1)× (N−1) sub-regions of the same size, a total current of the region is evaluated according to the devices in the region, and a node current assignment is averaging the total current of the region into each sub-region, wherein the current of any node is a sum of ¼ currents of the sub-regions in the corners of the node, where N is a number of nodes in each side of the region.

17. The system according to claim 10, wherein the power supply network model comprises 2×N×N package parasitic resistors, 2×N×N package inductors, 4×N×(N−1) on chip resistors, and N×N on node capacitors C, where N is a number of nodes in each side of the region.

* * * * *